US012288818B2

(12) United States Patent
Lin et al.

(10) Patent No.: US 12,288,818 B2
(45) Date of Patent: Apr. 29, 2025

(54) LATERAL DIFFUSION METAL OXIDE SEMICONDUCTOR DEVICE AND METHOD FOR FABRICATING THE SAME

(71) Applicant: UNITED MICROELECTRONICS CORP., Hsin-Chu (TW)

(72) Inventors: Zong-Han Lin, Tainan (TW); Yi-Han Ye, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 65 days.

(21) Appl. No.: 18/128,234

(22) Filed: Mar. 30, 2023

(65) Prior Publication Data

US 2023/0238457 A1 Jul. 27, 2023

Related U.S. Application Data

(63) Continuation of application No. 17/314,069, filed on May 7, 2021, now Pat. No. 11,652,168.

(30) Foreign Application Priority Data

Apr. 12, 2021 (CN) .......................... 202110388841.4

(51) Int. Cl.
*H01L 29/78* (2006.01)
*H01L 29/06* (2006.01)
*H01L 29/40* (2006.01)
*H01L 29/66* (2006.01)

(52) U.S. Cl.
CPC ...... *H01L 29/7816* (2013.01); *H01L 29/0653* (2013.01); *H01L 29/401* (2013.01); *H01L 29/407* (2013.01); *H01L 29/66681* (2013.01)

(58) Field of Classification Search
CPC . H01L 29/0653; H01L 29/402; H01L 29/407; H01L 29/43356; H01L 29/42376; H01L 29/66681; H01L 29/66795; H01L 29/7816; H01L 29/785
USPC ........................................................ 257/343
See application file for complete search history.

(56) References Cited

U.S. PATENT DOCUMENTS

| 9,590,053 | B2 | 3/2017 | Chou et al. | |
|---|---|---|---|---|
| 10,121,878 | B1 | 11/2018 | Ciavatti | |
| 10,164,006 | B1 | 12/2018 | Ciavatti | |
| 2009/0140343 | A1* | 6/2009 | Feilchenfeld | H01L 29/66689 257/E29.256 |
| 2016/0111488 | A1* | 4/2016 | Lu | H01L 21/76229 438/270 |
| 2017/0103896 | A1* | 4/2017 | Hung | H01L 21/76837 |
| 2017/0104097 | A1* | 4/2017 | Park | H01L 29/7835 |
| 2020/0135917 | A1 | 4/2020 | Singh | |

(Continued)

OTHER PUBLICATIONS

Lin, the specification, including the claims, and drawings in the U.S. Appl. No. 15/064,618, filed Mar. 9, 2016.

*Primary Examiner* — Fazli Erdem

(74) *Attorney, Agent, or Firm* — Winston Hsu

(57) ABSTRACT

A lateral diffusion metal oxide semiconductor (LDMOS) device includes a first fin-shaped structure on a substrate, a shallow trench isolation (STI) adjacent to the first fin-shaped structure, a first gate structure on the first fin-shaped structure, a spacer adjacent to the first gate structure, and a contact field plate adjacent to the first gate structure and directly on the STI. Preferably, a sidewall of the spacer is aligned with a sidewall of the first fin-shaped structure.

13 Claims, 3 Drawing Sheets

(56) References Cited

U.S. PATENT DOCUMENTS

| | | |
|---|---|---|
| 2020/0258987 A1 | 8/2020 | Chuang |
| 2021/0234041 A1 | 7/2021 | Jin |
| 2021/0296451 A1* | 9/2021 | Chen ................. H01L 21/76829 |

* cited by examiner

LATERAL DIFFUSION METAL OXIDE SEMICONDUCTOR DEVICE AND METHOD FOR FABRICATING THE SAME

CROSS REFERENCE TO RELATED APPLICATIONS

This application is a continuation application of U.S. application Ser. No. 17/314,069, filed on May 7, 2021. The content of the application is incorporated herein by reference.

BACKGROUND OF THE INVENTION

1. Field of the Invention

The invention relates to a method for fabricating semiconductor device, and more particularly, to a method of integrating lateral double-diffused metal-oxide-semiconductor (LDMOS) device with fin-shaped structures.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of LDMOS devise and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a lateral diffusion metal oxide semiconductor (LDMOS) device includes the steps of first forming a first fin-shaped structure and a second fin-shaped structure on a substrate, forming a shallow trench isolation (STI) between the first fin-shaped structure and the second fin-shaped structure, forming a first gate structure on the first fin-shaped structure and a second gate structure on the second fin-shaped structure, forming a source region on the first fin-shaped structure, forming a drain region on the second fin-shaped structure, and forming a contact field plate directly on the STI.

According to another aspect of the present invention, a lateral diffusion metal oxide semiconductor (LDMOS) device includes a first fin-shaped structure on a substrate, a shallow trench isolation (STI) adjacent to the first fin-shaped structure, a first gate structure on the first fin-shaped structure, and a contact field plate adjacent to the first gate structure and directly on the STI.

According to yet another aspect of the present invention, a lateral diffusion metal oxide semiconductor (LDMOS) device includes a first fin-shaped structure on a substrate, a shallow trench isolation (STI) adjacent to the first fin-shaped structure, a first gate structure on the first fin-shaped structure and the STI, and a contact field plate adjacent to the first gate structure and directly on the STI.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
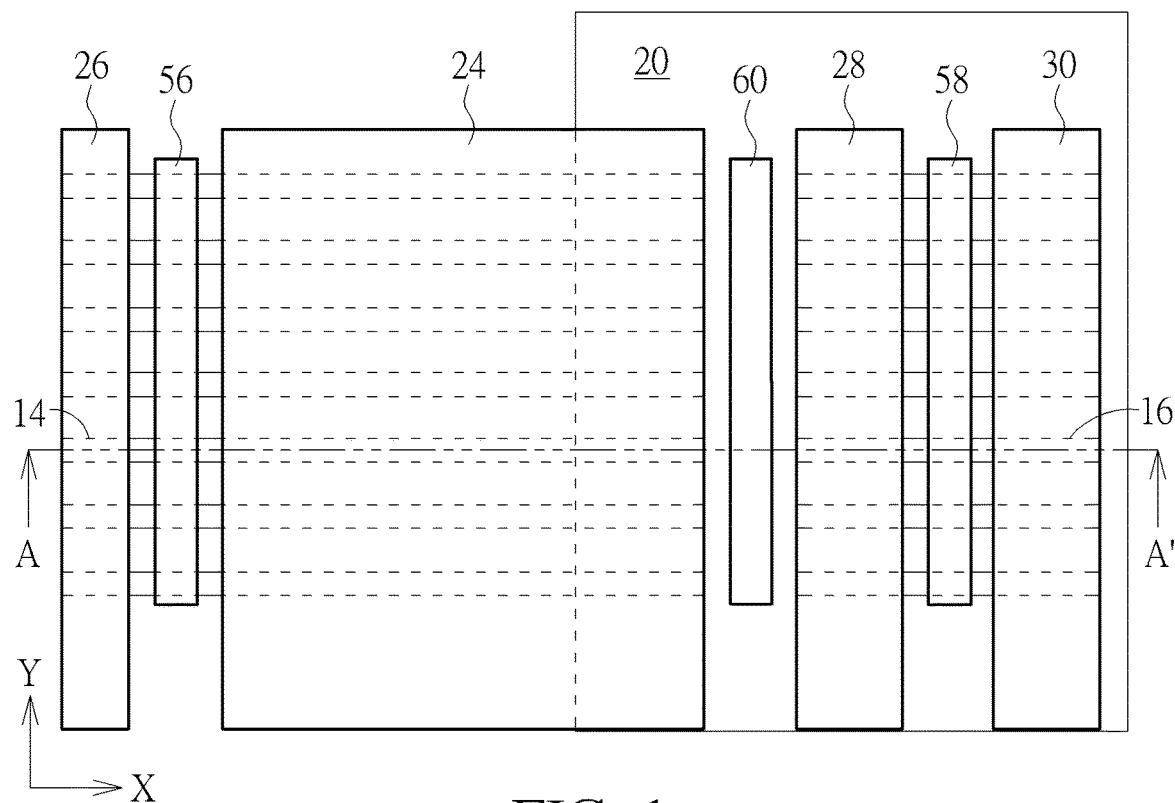
FIGS. 1-4 illustrate a method for fabricating LDMOS device according to an embodiment of the present invention.
Figure 2:
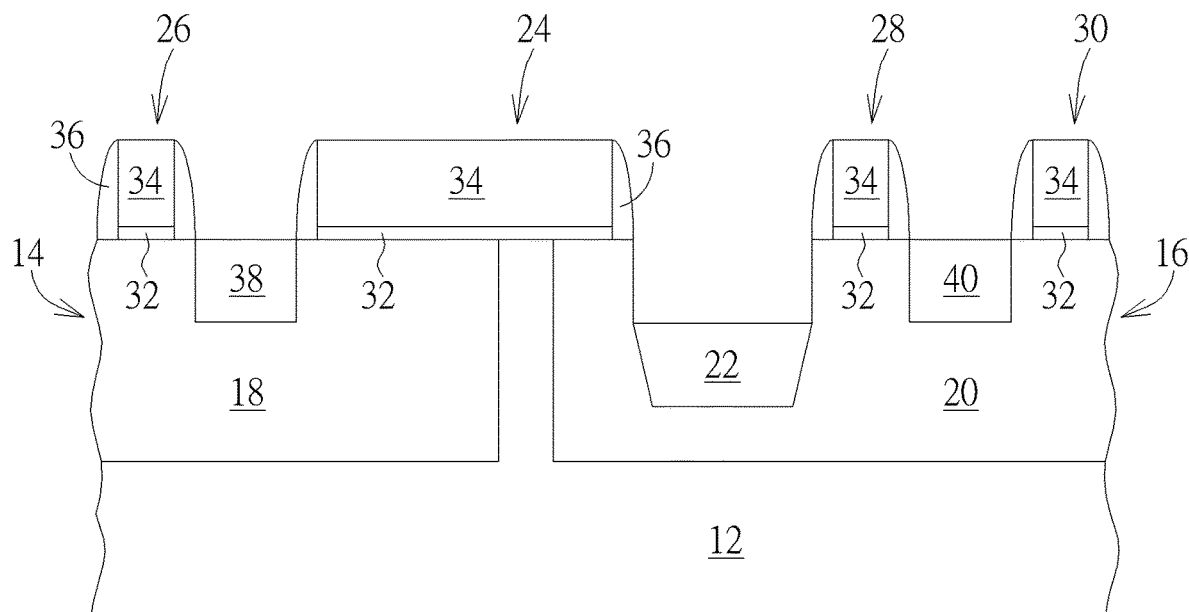
Figure 3:
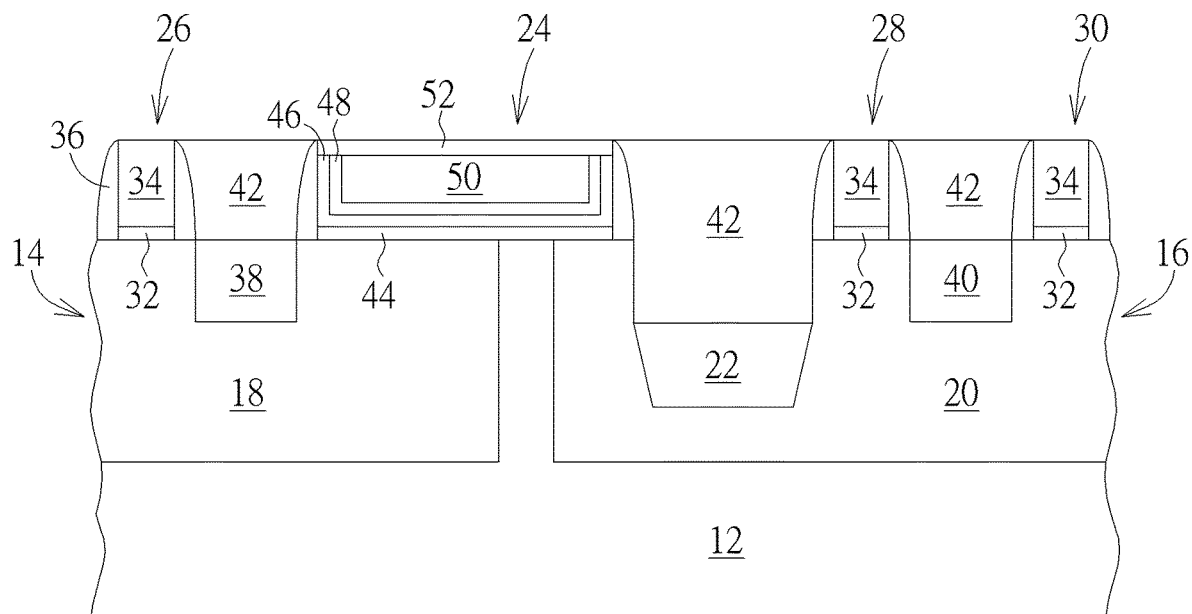
Figure 4:
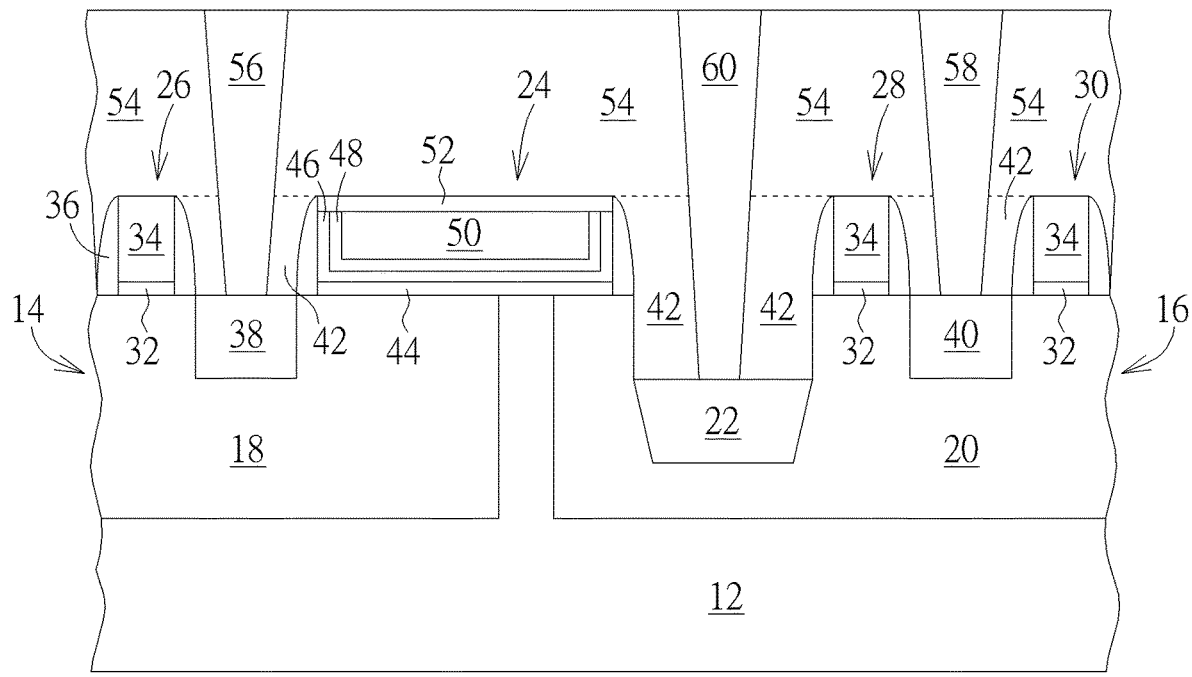

Referring to FIGS. 1-4, FIGS. 1-4 illustrate a method for fabricating LDMOS device according to an embodiment of the present invention, in which FIG. 1 illustrates a top view for fabricating the LDMOS device and FIGS. 2-4 illustrate cross-section views of FIG. 1 taken along the sectional line AA' for fabricating the LDMOS device. As shown in FIGS. 1-2, a substrate 12 is first provided and a plurality of fin-shaped structures such as a first fin-shaped structure 14 and a second fin-shaped structure 16 are formed on the substrate 12, a first well (such as p-well 18) and a second well (such as n-well 20) are formed in the first fin-shaped structure 14 and the second fin-shaped structure 16, and a shallow trench isolation (STI) 22 is formed between the first fin-shaped structure 14 and the second fin-shaped structure 16. Preferably, the top surface of the STI 22 is slightly lower than the top surface of the first fin-shaped structure 14 and the second fin-shaped structure 16, the first well (such as p-well 18) is completely disposed within the first fin-shaped structure 14, the second well (such as n-well 20) is disposed in both the second fin-shaped structure 16 and first fin-shaped structure 14, and the STI 22 is also disposed in or surrounded by the second well (such as n-well 20) completely.

In this embodiment, the substrate 12 could be a semiconductor substrate such as a silicon substrate, an epitaxial substrate, a SiC substrate, or a silicon-on-insulator (SOI) substrate and the shallow trench isolation (STI) 22 is preferably made of silicon oxide, but not limited thereto. It should also be noted that even though seven first fin-shaped structures 14 and seven second fin-shaped structures 16 are disposed extending along the Y-direction on the substrate 12 in the embodiment shown in FIG. 1, the quantity of the fin-shaped structures are not limited to seven but could all be adjusted depending on the demand of the product.

According to an embodiment of the present invention, the first fin-shaped structure 14 and the second fin-shaped structure 16 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate 12, and through an etching process, the pattern of the patterned mask is transferred to the substrate 12 to form the first fin-shaped structure 14 and the second fin-shaped structure 16. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding first fin-shaped structure 14 and second fin-shaped structure 16. These approaches for forming fin-shaped structures are all within the scope of the present invention.

Next, a gate structure 24 is formed on the first fin-shaped structure 14, a gate structure 26 is formed on the first fin-shaped structure 14 on the left side of the gate structure 24, and a gate structure 28 and gate structure 30 are formed on the second fin-shaped structure 16. In this embodiment, the formation of the gate structures 24, 26, 28, 30 could be accomplished by a gate first process, a high-k first approach from gate last process, or a high-k last approach from gate last process. Since this embodiment pertains to a high-k last approach, a gate dielectric layer 32 or interfacial layer made of silicon oxide, a gate material layer 34 made of polysilicon, and a selective hard mask (not shown) could be formed sequentially on the substrate 12, and a pattern transfer process is then conducted by using a patterned resist (not shown) as mask to remove part of the gate material layer and part of the gate dielectric layer through single or multiple etching processes. After stripping the patterned resist, gate structures 24, 26, 28, 30 composed of patterned gate dielectric layer and patterned gate material layer are formed on the substrate 12.

Next, at least a spacer 36 is formed on the sidewalls of each of the gate structures 24, 26, 28, 30, a source region 38 composed of n+ region is formed in the first fin-shaped structure 14 adjacent to one side of the gate structure 24, and a drain region 40 composed of another n+ region is formed in the second fin-shaped structure 16 adjacent to another side of the gate structure 28. In this embodiment, the spacer 36 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof.

The source region 38 and the drain region 40 could include n-type dopants or p-type dopants depending on the type of device being fabricated.

Next, as shown in FIG. 3, an interlayer dielectric (ILD) layer 42 is formed on the gate structures 24, 26, 28, 30 and the STI 22 and a planarizing process such as chemical mechanical polishing (CMP) process is conducted to remove part of the ILD layer 42 for exposing the gate material layers 34 made of polysilicon so that the top surfaces of the gate material layers 34 and the ILD layer 42 are coplanar. Next, a replacement metal gate (RMG) process is conducted to transform the gate structure 24 into metal gate. For instance, the RMG process could be accomplished by first forming a selective patterned mask (not shown) on the gate structures 26, 28, 30, conducting a selective dry etching or wet etching process using etchants including but not limited to for example ammonium hydroxide ($NH_4OH$) or tetramethylammonium hydroxide (TMAH) to remove the gate material layer 34 and even the gate dielectric layer 32 from gate structure 24 for forming a recess (not shown) in the ILD layer 42. Next, a selective interfacial layer 44 or gate dielectric layer (not shown), a high-k dielectric layer 46, a work function metal layer 48, and a low resistance metal layer 50 are formed in the recess, and a planarizing process such as CMP is conducted to remove part of low resistance metal layer 50, part of work function metal layer 48, and part of high-k dielectric layer 46 so that the top surfaces of the U-shape high-k dielectric layer 46, U-shaped work function metal layer 48, the low resistance metal layer 50, and the ILD layer 42 are coplanar.

In this embodiment, the high-k dielectric layer 46 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 48 is formed for tuning the work function of the metal gate in accordance with the conductivity of the device. For an NMOS transistor, the work function metal layer 48 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 48 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 48 and the low resistance metal layer 50, in which the material of the barrier layer may include titanium (Ti), titanium nitride (TiN), tantalum (Ta) or tantalum nitride (TaN). Furthermore, the material of the low-resistance metal layer 50 may include copper (Cu), aluminum (Al), titanium aluminum (TiAl), cobalt tungsten phosphide (CoWP) or any combination thereof. Next, part of the high-k dielectric layer 46, part of the work function metal layer 48, and part of the low resistance metal layer 50 are removed to form a recess (not shown), and a hard mask 52 is then formed into the recess so that the top surfaces of the hard mask 52 and ILD layer 42 are coplanar. The hard mask 52 could be made of material including but not limited to for example SiO$_2$, SiN, SiON, SiCN, or combination thereof.

Next, as shown in FIG. 4, another ILD layer 54 could be formed on the gate structures 24, 26, 28, 30 and the ILD layer 42, and a photo-etching process is conducted by using a patterned mask (not shown) as mask to remove part of the ILD layers 42, 54 adjacent to the gate structures 24, 26, 28, 30 for forming contact holes (not shown) exposing the source region 38, the drain region 40, and the STI 22. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned conductive materials for forming a contact plug 56 directly contacting the source region 38, a contact plug 58 directly contacting the drain region 40, and a contact field plate 60 on and directly contacting the STI 22. This completes the fabrication of a semiconductor device according to an embodiment of the present invention.

Referring again to FIG. 4, FIG. 4 illustrates a structural view of a LDMOS device according to an embodiment of the present invention. As shown in FIG. 4, the LDMOS device preferably includes a first fin-shaped structure 14 and a second fin-shaped structure 16 disposed on the substrate 12, a STI 22 disposed between the first fin-shaped structure 14 and the second fin-shaped structure 16, a gate structure 24 disposed on the first fin-shaped structure 14, a gate structure 28 disposed on the second fin-shaped structure 16, a source region 38 disposed adjacent to one side of the gate structure 24 on the first fin-shaped structure 14, a drain region 40 disposed on one side of the gate structure 28 on the second fin-shaped structure 16, ILD layers 42, 54 surrounding the gate structures 24, 28, a contact plug 45 disposed on the source region 38, a contact plug 58 disposed on the drain region 40, and a contact field plate 60 disposed on and directly contacting the STI 22 between the gate structures 24, 28. As shown in FIG. 1, the first fin-shaped structure 14 and the second fin-shaped structure 16 are disposed extending along a first direction such as X-direction while the contact plugs 56, 58, and the contact field plate 60 are disposed extending along a second direction such as Y-direction on the substrate 12.

It should be noted that since the contact field plate 60 and the contact plugs 56, 58 are all fabricated through the same process, the material composition of the contact field plate 60 and the contact plugs 56, 58 are preferably the same. Moreover, the gate structures 26, 28, 30 are dummy gate structures and the width of each of the gate structures 26, 28, 30 is less than the width of the gate structure 24, and the bottom surface of the contact field plate 60 is lower than the bottom surfaces of the contact plugs 56, 58 while the top surfaces of the contact field plate 60 and the contact plugs 56, 58 are coplanar. In other words, the overall height of the contact field plate 60 is greater than the height of the contact plug 56 connecting the source region 38 and the height of the contact plug 58 connecting the drain region 40.

Figure 5:
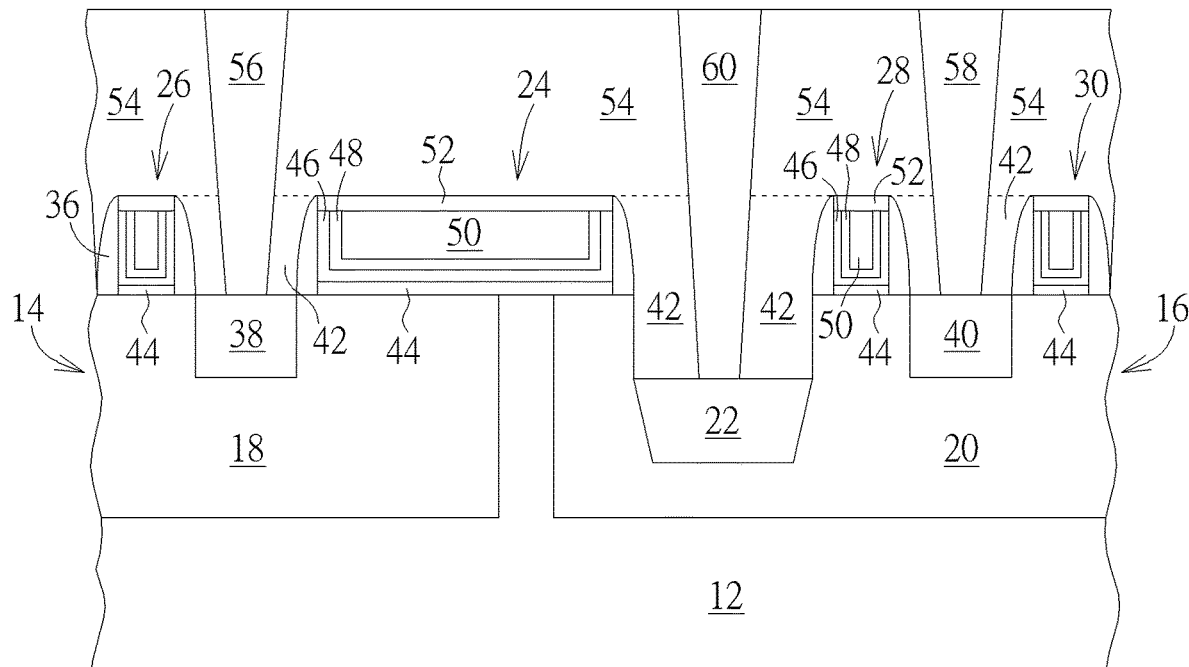
FIG. 5 illustrates a structural view of a LDMOS device according to an embodiment of the present invention.

Referring to FIG. 5, FIG. 5 illustrates a structural view of a LDMOS device according to an embodiment of the present invention. As shown in FIG. 5, in contrast to the aforementioned embodiment of only transforming the gate structure 24 into metal gate, it would also be desirable to omit the formation of patterned mask during the aforementioned RMG process so that all of the gate structures 24, 26, 28, 30 are transformed into metal gates. In other words, each of the gate structures 24, 26, 28, 30 would include an interfacial layer 44, a high-k dielectric layer 46, a work function metal layer 48, and a low resistance metal layer 50, which is also within the scope of the present invention.

Figure 6:
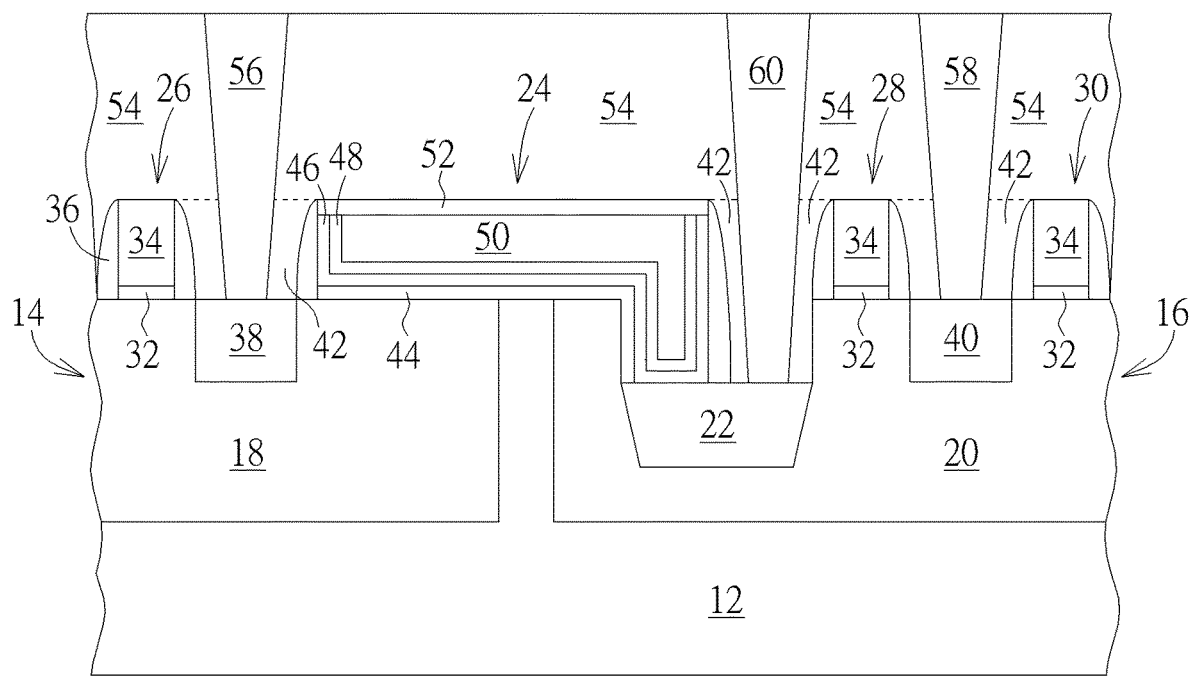
FIG. 6 illustrates a structural view of a LDMOS device according to an embodiment of the present invention.

Referring to FIG. 6, FIG. 6 illustrates a structural view of a LDMOS device according to an embodiment of the present invention. As shown in FIG. 6, the LDMOS device preferably includes a first fin-shaped structure 14 and a second fin-shaped structure 16 disposed on the substrate 12, a STI 22 disposed between the first fin-shaped structure 14 and the second fin-shaped structure 16, a gate structure 24 disposed on the first fin-shaped structure 14, a gate structure 28 disposed on the second fin-shaped structure 16, a source region 38 disposed adjacent to one side of the gate structure 24 on the first fin-shaped structure 14, a drain region 40 disposed on one side of the gate structure 28 on the second fin-shaped structure 16, ILD layers 42, 54 surrounding the gate structures 24, 28, a contact plug 45 disposed on the source region 38, a contact plug 58 disposed on the drain region 40, and a contact field plate 60 disposed on and directly contacting the STI 22 between the gate structures 24, 28.

In contrast to the aforementioned embodiment of disposing the gate structure 24 only on the first fin-shaped structure 14 without extending to the top surface of the STI 22 or the sidewall of the spacer 36 adjacent to the gate structure 24 is aligned to the sidewall of the first fin-shaped structure 14, it would also be desirable to extend the gate structure 24 toward right during the pattering of the gate structures 24, 26, 28, 30 so that the gate structure 24 would standing directly on top of the STI 22. Next, the RMG process and contact formation conducted in FIG. 3 are carried out to transform the gate structure 24 into metal gate and then form the contact field plate 60 adjacent to the gate structure 24. In this embodiment, the gate structure 24 and the contact field plate 60 are disposed on and directly contacting the STI 22 at the same time, in which the bottom surface of the gate structure 24 disposed on the STI 22 is even with the bottom surface of the contact field plate 60 and lower than the top surfaces of the first fin-shaped structure 14 and the second fin-shaped structure 16.

Similar to the aforementioned embodiment, since the contact field plate 60 and the contact plugs 56, 58 are all fabricated through the same process, the material composition of the field plate 60 and the contact plugs 56, 58 are preferably the same. Moreover, the gate structures 26, 28, 30 are dummy gate structures and the width of each of the gate structures 26, 28, 30 is less than the width of the gate structure 24, and the bottom surface of the contact field plate 60 is lower than the bottom surfaces of the contact plugs 56, 58 while the top surfaces of the contact field plate 60 and the contact plugs 56, 58 are coplanar. In other words, the overall height of the contact field plate 60 is greater than the height of the contact plug 56 connecting the source region 38 and the height of the contact plug 58 connecting the drain region 40. It should be noted that even though the embodiment shown in FIG. 4 pertains to a gate structure 24 including metal gate and gate structures 26, 28, 30 including polysilicon gates, according to other embodiment of the present invention it would also be desirable to apply the extended gate structure 24 to the embodiment shown in FIG. 5 so that all the gate structures 24, 26, 28, 30 are all made of metal gates, which is also within the scope of the present invention.

Typically, gate structures or gate electrodes of current LDMOS devices are extended to form field plate for reaching higher breakdown voltage. To improve the current design for fabricating LDMOS device without increasing cost and over complicating current processes, the present invention preferably forms an additional contact plug serving as contact field plate directly on the STI during the fabrication of source region and drain region contact plugs so that the LDMOS device could use the coupling effect created by the contact field plate 60, the ILD layers 42, 54 and the gate structure 24 for increasing overall breakdown voltage of the device. According to other embodiments of the present invention, in addition to forming the contact field, the gate structure of the LDMOS device could also be formed not extending on top of the STI as shown in FIGS. 4-5 or extending directly on top of the STI so that both the gate structure and contact field plate are standing on top of the STI as shown in FIG. 6, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral diffusion metal oxide semiconductor (LDMOS) device, comprising:
   a first fin-shaped structure on a substrate;
   a shallow trench isolation (STI) adjacent to the first fin-shaped structure;
   a first gate structure on the first fin-shaped structure;
   a spacer adjacent to the first gate structure, wherein a sidewall of the spacer is aligned with a sidewall of the first fin-shaped structure;
   a contact field plate adjacent to the first gate structure and directly on the STI; and
   an interlayer dielectric (ILD) layer between the spacer and the contact field plate, wherein a bottom surface of the ILD layer is even with a bottom surface of the contact field plate and lower than a bottom surface of the first gate structure.

2. The semiconductor device of claim 1, further comprising:
   a second fin-shaped structure adjacent to the first fin-shaped structure, wherein the STI is between the first fin-shaped structure and the second fin-shaped structure;
   a second gate structure on the second fin-shaped structure;
   a source region adjacent to one side of the first gate structure on the first fin-shaped structure;
   a drain region adjacent to one side of the second gate structure on the second fin-shaped structure;
   the interlayer dielectric (ILD) layer around the first gate structure and the second gate structure; and
   a first contact plug on the source region and a second contact plug on the drain region.

3. The semiconductor device of claim 2, wherein the contact field plate is between the first gate structure and the second gate structure.

4. The semiconductor device of claim 2, wherein a width of the second gate structure is less than a width of the first gate structure.

5. The semiconductor device of claim 2, wherein the contact field plate and the first contact plug comprise same material.

6. The semiconductor device of claim 2, wherein a bottom surface of the contact field plate is lower than a bottom surface of the first contact plug.

7. The semiconductor device of claim 2, wherein top surfaces of the contact field plate and the first contact plug are coplanar.

8. A lateral diffusion metal oxide semiconductor (LDMOS) device, comprising:
   a first fin-shaped structure on a substrate;
   a shallow trench isolation (STI) adjacent to the first fin-shaped structure;
   a first gate structure on the first fin-shaped structure and the STI, wherein a bottom surface of the first gate structure comprises a step-shape;
   a first spacer adjacent to one side of the first gate structure;
   a second spacer adjacent to another side of the first gate structure; and
   a contact field plate adjacent to the first gate structure and directly on the STI, wherein a bottom surface of the second spacer is lower than a bottom surface of the first spacer and even with the bottom surface of the first gate structure and a bottom surface of the contact field plate.

9. The semiconductor device of claim 8, further comprising:
   a second fin-shaped structure adjacent to the first fin-shaped structure, wherein the STI is between the first fin-shaped structure and the second fin-shaped structure;
   a second gate structure on the second fin-shaped structure;
   a source region adjacent to one side of the first gate structure on the first fin-shaped structure;
   a drain region adjacent to one side of the second gate structure on the second fin-shaped structure;
   an interlayer dielectric (ILD) layer around the first gate structure and the second gate structure; and
   a first contact plug on the source region and a second contact plug on the drain region.

10. The semiconductor device of claim 9, wherein the contact field plate is between the first gate structure and the second gate structure.

11. The semiconductor device of claim 9, wherein the contact field plate and the first contact plug comprise same material.

12. The semiconductor device of claim 9, wherein a bottom surface of the contact field plate is lower than a bottom surface of the first contact plug.

13. The semiconductor device of claim 9, wherein top surfaces of the contact field plate and the first contact plug are coplanar.

* * * * *